(12) United States Patent
Horiuchi et al.

(10) Patent No.: US 6,660,942 B2
(45) Date of Patent: Dec. 9, 2003

(54) SEMICONDUCTOR DEVICE WITH AN EXPOSED EXTERNAL-CONNECTION TERMINAL

(75) Inventors: Michio Horiuchi, Nagano (JP); Takashi Kurihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 74 days.

(21) Appl. No.: 09/826,512

(22) Filed: Apr. 5, 2001

(65) Prior Publication Data

US 2001/0027874 A1 Oct. 11, 2001

(30) Foreign Application Priority Data

Apr. 6, 2000 (JP) .......................................... 2000-110581

(51) Int. Cl.[7] ................................................. H05K 1/03
(52) U.S. Cl. ...................... 174/258; 174/256; 174/260; 361/768; 361/771; 361/779
(58) Field of Search ................................. 174/260, 256, 174/258, 259, 255; 361/771, 768, 777, 779

(56) References Cited

U.S. PATENT DOCUMENTS

| | | | | |
|---|---|---|---|---|
| 5,737,191 A | * | 4/1998 | Horiuchi et al. ............. | 174/251 |
| 5,872,393 A | | 2/1999 | Sakai et al. | |
| 5,874,780 A | * | 2/1999 | Murakami ................... | 174/260 |
| 5,943,212 A | | 8/1999 | Horiuchi et al. | |
| 6,208,525 B1 | * | 3/2001 | Imasu et al. ................. | 174/255 |
| 6,340,606 B1 | * | 1/2002 | Hashimoto ................... | 257/778 |
| 6,353,189 B1 | * | 3/2002 | Shimada et al. ............. | 174/255 |

FOREIGN PATENT DOCUMENTS

| | | |
|---|---|---|
| EP | 1030357 A | 8/2000 |
| JP | 5-47842 | 2/1993 |
| JP | 05047842 A | 2/1993 |
| JP | 10-270496 | 10/1998 |
| WO | WO99/23696 A | 5/1999 |

OTHER PUBLICATIONS

Patent Abstracts of Japan, vol. 017, No. 344 (E–1390), Jun. 29, 1993.

* cited by examiner

*Primary Examiner*—David L. Talbott
*Assistant Examiner*—José H Alcala
(74) *Attorney, Agent, or Firm*—Paul & Paul

(57) ABSTRACT

A wiring substrate equipped with a rerouted wiring having one end connected to an electronic-part mounting pad for electrically connecting an electronic part and another end connected to an external-connection terminal. In the wiring substrate, a low-elasticity underlayer made of a material having a lower modulus of elasticity than that of a base material of the wiring substrate is disposed between the base material of the wiring substrate and each of the electronic-part mounting pad and the rerouted wiring. A method of manufacturing the wiring substrate and a semiconductor device using the wiring substrate are also disclosed.

18 Claims, 7 Drawing Sheets

SEMICONDUCTOR DEVICE WITH AN EXPOSED EXTERNAL-CONNECTION TERMINAL

BACKGROUND OF THE INVENTION

1. Field of the Invention

The present invention relates to a packaging technique for electronic parts. More particularly, the present invention relates to a wiring substrate capable of packaging electronic parts in accordance with the COB (chip-on-board) system, a method of manufacturing the wiring substrate, and a semiconductor device using the wiring substrate. The "electronic part" used herein refers to various kinds of parts that can be mounted on the wiring substrate. Specifically, the electronic parts include semiconductor elements such as IC chips and LSI chips, passive elements, and a power source. Therefore, the semiconductor device of the present invention can also be referred to as an electronic device.

2. Description of the Related Art

Recently, there have been many requests for reduction in size, reduction in thickness, and reduction in weight of devices, as well as increase in performance, in the fields of electronic devices such as personal computers, portable telephones, and PHS's. In order to meet these requests, techniques of packaging semiconductor elements on wiring substrates have been developed and practically used.

Various packaging techniques have already been known. As one of these techniques, there is a flip-chip bonding method. The flip-chip bonding method is for directly mounting a semiconductor element onto a wiring substrate through a metal bump disposed between a pad of the wiring substrate and an external-connection terminal of the semiconductor element. This method does not use a conductive wire, that cannot match with a complex structure having complex wiring, for electrically connecting and mounting the semiconductor element onto the wiring substrate. When the metal bump is melted under a heat treatment, it is possible to electrically connect the semiconductor element onto the wiring substrate, by fixing the pad of the wiring substrate and the external-connection terminal of the semiconductor element together. According to this method, however, thermal stress attributable to a difference between the coefficient of thermal expansion of the wiring substrate and that of the semiconductor element is concentrated onto the metal bump, and this damages the bump, itself, when the metal bump is heated to melt it.

In order to solve the above problems, various trials have been made to relax the stress through the improvement in a packaging structure. For example, there is a method of filling a resin into a gap between a wiring substrate and a semiconductor element after the pad of the wiring substrate and the external-connection terminal of the semiconductor element have been fixed together with a metal bump. This method is called an under-fill structure method. It is possible to prevent damage to the metal bump by reinforcing the mechanical strength of the bump relying upon the mechanical strength of the resin. However, according to this method, it is not possible to completely avoid damage to the bump, as the concentration of the thermal stress onto the bump is not prevented.

In order to prevent the thermal stress from being concentrated onto the bump, there is a method of disposing a sheet-like thermosetting resin type adhesive into the gap between a wiring substrate and a semiconductor element, instead of filling a resin into this gap. According to this method, the semiconductor element is disposed on the wiring substrate via the adhesive. Then, the semiconductor element is thermally compressed, so that the adhesive is cured in a state that the metal bump has been connected to the pad of the wiring substrate. When the temperature of the semiconductor element has been returned to room temperature, a compressive force like thermal compressive force is generated in the cured adhesive. Based on this compressive force, the metal bump is pressed against the pad of the wiring substrate. According to this method, the terminal of the semiconductor element and the pad of the wiring substrate are not fixed together via the metal bump. Therefore, it is possible to prevent the concentration of the thermal stress attributable to the difference between the coefficient of thermal expansion of the wiring substrate and that of the semiconductor element onto the metal bump. However, according to this method, when the coefficient of thermal expansion of the adhesive is larger than that of the metal bump, there arises a gap between the bump and the pad at the time of a testing temperature cycle. This brings about a problem of a poor connection between the bump and the pad.

In order to improve the reliability of the connection between the pad of the wiring substrate and the metal bump, a semiconductor device as shown in FIG. 1 has been proposed in Japanese Unexamined Patent Publication (Kokai) No. 10-270496. In this semiconductor device, a semiconductor chip 60 is mounted on the packaging surface of a wiring substrate 51 having a rigid substrate 52 via an adhesive 66. An external-connection terminal 63 of the semiconductor chip 60 is connected to a pad 54A of the wiring substrate 51 via a bump electrode 65. Particularly, in the case of the semiconductor device shown in FIG. 1, a recess 54B is formed on the pad 54A, and the pad 54A and the bump electrode 65 are connected together within this recess 54B. The pad 54A is formed on the surface of an elastic layer 53. The recess 54B of the pad 54A is formed based on an elastic deformation of the pad and the elastic layer 53. The elastic layer 53 is formed with an epoxy-type low-elasticity resin having a lower coefficient of thermal expansion than that of the adhesive. When this structure is employed, it is possible to reduce the gap between the wiring substrate 51 and the semiconductor chip 60 by the volume corresponding to the concave volume of the recess 54. Therefore, it is possible to lower the thermal expansion of the adhesive in its thickness direction as a result of the reduction in the thickness of the adhesive. As a result, it is possible to prevent the occurrence of a poor connection at the time of the temperature cycle test.

SUMMARY OF THE INVENTION

As described above, various studies have so far been carried out and proposals have been made on methods useful for increasing the reliability of the connection between the pad of the wiring substrate and the metal bump. However, all the methods entrust the stress relaxation to the improvement in the package structure. Therefore, these methods lead to a complex structure, which complicates the manufacture process and causes an increased manufacturing cost.

It is, therefore, an object of the present invention to provide a wiring substrate capable of increasing the reliability of the connection between a pad of a wiring substrate and an electronic part like a semiconductor chip, without complicating the structure and the manufacturing process.

It is another object of the present invention to provide a method suitable for manufacturing this wiring substrate.

It is still another object of the present invention to provide a semiconductor device that uses this wiring substrate.

The above objects and other objects of the present invention will be easily understood from the following detailed explanation.

As a result of a concentrated study for achieving the above objects, the present inventors have found that the improvement in the wiring substrate in place of the improvement in the package, along with movable wiring of a conductive pattern on the wiring substrate, are effective for achieving the objects.

According to one aspect of the present invention, there is provided a wiring substrate equipped with a rerouted wiring having one end connected to an electronic-part mounting pad for electrically connecting an electronic part and another end connected to an external-connection terminal. In this wiring substrate, a low-elasticity underlayer, i.e., underlayer made of a material having a lower modulus of elasticity than that of a base material of the wiring substrate is disposed between the base material of the wiring substrate and each of the electronic-part mounting pad and the rerouted wiring.

Further, according to another aspect of the present invention, there is provided a method of manufacturing a wiring substrate of the present invention, the method comprising the steps of:

forming a low-elasticity underlayer, from a material having a lower modulus of elasticity than that of a base material of the wiring substrate, in a pattern that the external-connection terminal formed on the base material of the wiring substrate is exposed; and forming the electronic-part mounting pad and the rerouted wiring in predetermined patterns, respectively, on the low-elasticity underlayer.

Further, according to still another aspect of the present invention, there is provided a method of manufacturing a wiring substrate of the present invention, the method comprising the steps of:

forming a high-elasticity underlayer from a material having a higher modulus of elasticity than that of a base material of the wiring substrate, followed by forming a low-elasticity underlayer from a material having a lower modulus of elasticity than that of the base material in a region smaller than the region of the high-elasticity underlayer, and forming a conductive metal layer in substantially the same region as that of the high-elasticity underlayer; and selectively removing the conductive metal layer, thereby forming the electronic-part mounting pad, the rerouted wiring, and the external-connection terminal in predetermined patterns, respectively.

Apparently, the "high-elasticity" underlayer is an underlayer made of a material having a higher modulus of elasticity than that of a base material of the wiring substrate.

Furthermore, according to still another aspect of the present invention, there is provided a method of manufacturing a wiring substrate of the present invention, the method comprising the steps of:

forming a low-elasticity underlayer from a material having a lower modulus of elasticity than that of a base material of the wiring substrate, followed by forming a high-elasticity underlayer from a material having a higher modulus of elasticity than that of the base material in a region smaller than the region of the low-elasticity underlayer, and forming a conductive metal layer in substantially the same region as that of the low-elasticity underlayer; and selectively removing the conductive metal layer, thereby forming the electronic-part mounting pad, the rerouted wiring, and the external-connection terminal in predetermined patterns, respectively.

In addition, according to still another aspect of the present invention, there is provided a semiconductor device that includes the wiring substrate of the present invention, and an electronic part electrically connected and mounted on the pad of the wiring substrate.

DESCRIPTION OF THE PREFERRED EMBODIMENTS

Figure 1:
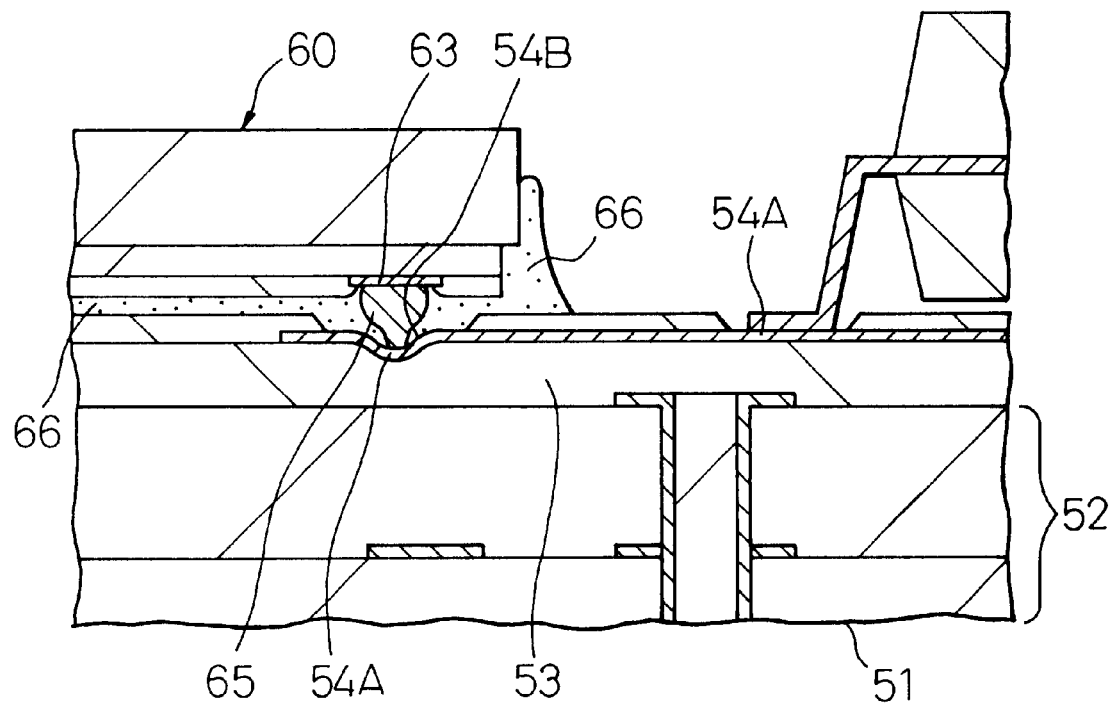
FIG. 1 is a cross-sectional view showing one example of the prior art semiconductor device.

A wiring substrate according to the present invention has packaged, on a packaging substrate thereof, an electronic-part mounting pad for electrically connected an electronic part, a rerouted wiring, and an external-connection terminal. The term "rerouted wiring" used herein means wiring in a broad definition. As is clear from the following explanation, the "rerouted wiring" means patterns of various conductive metals that are provided on the wiring substrate for the purpose of arranging wires on the wiring substrate. Therefore, the rerouted wiring is also called a "conductor", a "wiring layer", and a "wiring pattern". Further, the rerouted wiring is usually provided on the front surface or the rear surface of the wiring substrate, however, it may also be provided inside the wiring substrate as an internal layer, if desired.

A packaging substrate which is also referred to as a "base material" herein may be a conventional substrate or an improved substrate thereof. As suitable base materials, there are, for example, a hard resin substrate, a metal substrate, a ceramic substrate, and a printed substrate. The hard resin substrate includes, for example, a substrate prepared from a resin reinforced with a reinforcing material like a glass fiber, a Kevlar™ resin, etc., and a substrate prepared from a glass polyimide resin, a glass epoxy resin, a glass bismaleiimide triazine (BT), a glass polyphenylene ether (PPE) resin, etc. The metal substrate comprises a base material such as aluminum, iron, or copper, having applied thereon via an organic insulation film (for example, a polyimide resin, an epoxy resin, etc.) a circuit pattern. Specifically, they include an IMS substrate, a metal core substrate, and an enamel substrate. The ceramic substrate is a base material of a high-purity fine ceramic, on which a circuit pattern has been formed. As suitable ceramic substrates, there are an alumina (aluminum oxide) substrate, an AlN substrate (an aluminum nitride substrate), and a low-temperature sintered substrate. The printed substrate includes various substrates having a circuit pattern formed on them based on a print wiring technique. As a typical example of such substrates, there is a built-up substrate. The built-up substrate is a multi-layer printed wiring substrate having conductive layers and insulation layers sequentially laminated on the base material by plating or screen printing, as is known.

On the wiring substrate of the present invention, various wiring elements like a pad for electrically connecting and mounting an electronic part (particularly, an electrode pad; hereinafter referred to as an "electronic-part mounting pad"), a rerouted wiring, and an external-connection terminal can be formed in optional patterns using general and conventional techniques in this technical field.

While it is possible to form these wiring elements using conventional techniques, it is preferable that they are generally formed using a thin film or a film of various general conductive metals, such as copper and aluminum (hereinafter referred to as a "metal layer"). When conductivity and processability are taken into account, it is particularly preferable that a copper foil is used as a material for forming wiring elements. The thickness of the copper foil used is usually 10 to 30 $\mu$m, and it is more preferable that the thickness of around 20 $\mu$m is used. In order to prevent the copper foil from being oxidized to fail in achieving a satisfactory connection, and also in order to guarantee the connection of a wiring element formed from the copper foil (such as a lead, a wire, and an electrode) with other parts, it is preferable that a conductive metal is plated on one surface or both surfaces of the copper foil. Gold plating, silver plating, tin plating, or nickel plating is suitable metal plating. Particularly, gold plating is preferable. The thickness of the metal plating can be changed over a wide range. Usually, the thickness is around 1 $\mu$m.

In order to adhere the copper foil to the base material, it is possible to use an adhesive commonly used in the manufacture of a semiconductor device. A suitable adhesive is, for example, a thermosetting epoxy type adhesive that is excellent in adhesiveness and heat resistance. The thickness of an adhesive layer formed using this adhesive can be changed over a wide range according to a kind of adhesive used and a desired adhesive strength. Usually, the thickness of an adhesive layer is about 10 to 40 $\mu$m. The adhesive layer can be formed based on the coating of a solution of a suitable adhesive, or the adhering of a sheet-shaped adhesive.

After the copper foil has been adhered to the surface of the base material, unnecessary portions are removed to form a desired wiring element like a lead, a wire, and an electrode. This process can be advantageously carried out according to a conventional etching process in the manufacture of a semiconductor device. For masking the copper foil at a portion desired to be left as a wiring element, an etching resist is selectively covered on the copper foil. Thereafter, the exposed unnecessary copper foil is removed by dissolving and removing the copper foil with a suitable etching liquid, like a solution of ferric chloride, for example. When necessary, the above-described copper foil plating may be further carried out after this etching.

The wiring element can be formed in a desired pattern using a common thin-film forming method like a sputtering method, a deposition method, etc., according to the needs. When this film-forming method is used, it is possible to form a wiring pattern of a thin uniform film thickness in high precision, and it is not necessary to use the above adhesive. A film-forming material that can be advantageously used in the above method is also a conductive metal like copper and gold.

In the wiring substrate of the present invention, in order to relax the thermal stress attributable to a difference between the coefficient of thermal expansion of the electronic part and that of the wiring substrate and to secure an increased reliability of the connection, it is essential to achieve the following. That is, it is essential to dispose a low-elasticity underlayer made of a material having a lower modulus of elasticity than that of the base material between the base material and the electronic-part mounting pad and the rerouted wiring both formed on this base material. Based on the existence of this low-elasticity underlayer, it is possible to effectively relax the thermal stress attributable to a difference between the coefficient of thermal expansion of the electronic part and that of the wiring substrate. Further, as this is achieved through the improvement in the substrate as explained above, it is possible to avoid the complication of the device, unlike the conventional method that depends on the improvement in the package.

For the formation of the low-elasticity underlayer, it is possible to use various low-elasticity materials that are known to have a relatively low modulus of elasticity. Suitable low-elasticity materials include, for example, a thermosetting resin like an epoxy resin that includes an NBR rubber or an acrylic rubber, and a thermoplastic resin like a polyolefin resin and a polyimide resin.

For these low-elasticity materials, it is possible to define a preferable range of their modulus of elasticity in Young's modulus. According to the knowledge of the present inventors obtained through their experience, it is preferable that the low-elasticity underlayer included in the wiring substrate has a Young's modulus of less than 1 GPa based on a measurement at a room temperature (20 to 30° C.) and has a Young's modulus of 10 MPa or less based on a measurement at 150° C. When a measured Young's modulus is out of the above range, it is difficult to achieve the relaxation of the stress to a satisfactory level.

The low-elasticity underlayer can be formed preferably by lamination of a sheet material or by spin coating of a solution of a selected low-elasticity material. The film thickness of the low-elasticity underlayer formed can be changed over a wide range according to a region in which the underlayer is formed and a desired level of stress relaxation. However, from the viewpoint of a reduction in the total thickness of the wiring substrate and an easy formation of the wiring element, it is usually preferable that the thickness is as small as possible. Therefore, it is generally preferable that the film thickness of the low-elasticity underlayer is within a range of 20 to 200 µm. More preferably, the film thickness of the low-elasticity underlayer is within a range of 25 to 50 µm.

In the wiring substrate of the present invention, after the above low-elasticity underlayer has been formed on the base material, the electronic-part mounting pad and the rerouted wiring are formed in accordance with the above-described methods. The present inventors have found that it is preferable to form a solder resist layer in a shape to cover the wiring elements like the electronic-part mounting pad and the rerouted wiring after they have been formed. Further, the present inventors have found that it is further preferable that this solder resist layer is made of a material having a relatively low modulus of elasticity like the low-elasticity underlayer. By sandwiching the wiring elements with the low-elasticity material, it is possible to further increase the desired effect of stress relaxation, in addition to the work effects of the solder resist layer itself like the simplification of the wiring, and the improvement in reliability. Therefore, it is preferable that the solder resist layer is formed with a resist material having a Young's modulus of less than 1 GPa based on a measurement at a room temperature (20 to 30° C.) and a Young's modulus of 10 MPa or less based on a measurement at 150° C.

According to one preferred embodiment, in a wiring substrate of the present invention, a low-elasticity underlayer is disposed between a base material of the wiring substrate and each of an electronic-part mounting pad and a rerouted wiring. Particularly, the low-elasticity underlayer extends between the base material of the wiring substrate and an external-connection terminal. In this case, it is preferable that the low-elasticity underlayer in the region of the electronic-part mounting pad and the rerouted wiring has a thickness of 50 µm or more, and the low-elasticity underlayer in the region of the external-connection terminal has a thickness of 10 µm or less. Further, it is preferable that usually a high-elasticity underlayer is disposed between the base material of the wiring substrate and the external-connection terminal as described below. When the low-elasticity underlayer is formed to have different film thicknesses as explained above, it is possible to further increase the stress relaxation effect.

Further, according to another preferred embodiment, in a wiring substrate of the present invention, an external-connection terminal is mounted on the base material, in addition to an electronic-part mounting pad and a rerouted wiring. It is preferable that the external-connection terminal has, as its underlayer, a high-elasticity underlayer made of a material having a relatively high modulus of elasticity between the base material of the wiring substrate and the external-connection terminal. It is preferable that the high-elasticity underlayer is provided beneath the low-elasticity underlayer so as to extend to a region of the low-elasticity underlayer. In the wiring substrate, when a relatively hard and stiff layer is disposed inside and a relatively soft and elastic layer is disposed above this layer as the ground of the wiring element, it is possible to further increase the stress relaxation effect. This facilitates and ensures the mounting of the electronic part. Therefore, it is necessary that the high-elasticity underlayer has at least a Young's modulus of 1 GPa or above based on a measurement at a room temperature (20 to 30° C.) and has a Young's modulus that exceeds 10 MPa based on a measurement at 150° C. It is preferable that a difference between the Young's modulus of the low-elasticity underlayer and that of the high-elasticity underlayer is as large as possible. However, it is desirable to avoid an extremely large difference as this has a risk of generating a bad effect in the stress relaxation obtained and in the result of film forming.

The high-elasticity underlayer can be formed in accordance with a method similar to that of forming the low-elasticity underlayer. In other words, it is possible to form the high-elasticity underlayer by laminating a sheet of a high-elasticity material like an epoxy resin and a polyimide resin that can satisfy the above-described conditions of Young's modulus, onto the base material. The material of the high-elasticity underlayer may be the same as or different from that used for the low-elasticity underlayer. The film thickness of the high-elasticity underlayer can be changed over a wide range based on a region in which the underlayer is formed, the characteristics of the low-elasticity underlayer used in combination, and a desired level of stress relaxation. However, it is usually preferable that the thickness is as small as possible. It is generally preferable that the film thickness of the high-elasticity underlayer is within a range of 20 to 100 µm. More preferably, the film thickness of the high-elasticity underlayer is within a range of 20 to 50 µm.

Further, in the wiring substrate of the present invention, it is preferable that, among the wiring elements, the rerouted wiring is formed in a nonlinear pattern at least at one portion of the rerouted wiring. In other words, among the wiring elements connected to the rerouted wiring, it is preferable that the rerouted wiring is formed in a nonlinear pattern, with one end connected to the electronic-part mounting pad and the other end connected to the external-connection terminal, particularly on the low-elasticity underlayer. This nonlinear pattern of the rerouted wiring can be changed according to a layer structure of the wiring substrate. However, usually it is preferable that the rerouted wiring has a curved pattern. Specifically, it is preferable that the rerouted wiring has an optionally bent pattern obtained by a curved line. When a nonlinear wiring is provided on the low-elasticity underlayer, it becomes possible to modify the shape of the rerouted wiring in a plane direction. As a result, it is possible to optionally bend the wiring substrate without involving such inconvenience as disconnection. Therefore, it is possible to make the device compact, and to improve the workability and the reliability.

In the wiring substrate of the present invention, the electronic parts mounted on this wiring substrate include various kinds of parts used in the electronic devices as defined before. As a representative electronic part, there is a semiconductor chip. When the wiring substrate is used in lamination, the electronic part itself may be the wiring substrate.

It is preferable that the electronic part is equipped with metal bumps for having electric connection with the wiring substrate at predetermined positions. The distribution and number of the metal bumps can be optionally changed according to the connection positions and the number of metal bumps.

The metal bumps of the electronic part can be optional metal bumps that are generally used in the field of electronic packaging. The metal bumps are usually formed on electrodes (made of aluminum, for example) of the electronic part. According to need, the metal bumps may also be formed on portions other than electrodes directly or through a suitable conductive metal. The metal bumps include ball bumps that are formed with gold (Au), nickel (Ni), copper (Cu) or high-melting point solder (Pb/Sn) according to an electrolytic plating method or a deposition method, and stud bumps that are formed with gold (Au) according to the wire bonding method. The metal bumps are not limited to these bumps. When it is possible to obtain a desired electric connection by another method, the metal bumps need not exist. Alternately, connection mediums other than the metal bumps may be provided.

The wiring substrate of the present invention has been explained above with particular reference to the preferred embodiments thereof. However, the wiring substrate of the present invention can employ an optional structure other than the range of structures of the present invention explained above. For example, the wiring substrate is not limited to the electronic-part mounting pad, the rerouted wiring and the external-connection terminal explained above. As other wiring elements that can be built into the wiring substrate, there are via-holes, pins and balls that are usually regarded as a part of the wiring.

The wiring substrate of the present invention can be manufactured according to various processes. According to one preferred embodiment, the wiring substrate of the present invention can have an external-connection terminal formed on the base material in a predetermined pattern. This external-connection terminal can be formed by the etching of a conductive metal layer as described above.

Next, according to the present invention, a low-elasticity underlayer is formed from a material having a lower modulus of elasticity than that of the base material of the wiring substrate on the base material in such a manner that the external-connection terminal that has already been formed on the base material is exposed. The low-elasticity underlayer can be formed by laminating a low-elasticity material sheet on the base material, through a copper foil disposed on this sheet, as described above.

After the low-elasticity underlayer has been formed in the manner as described above, the copper foil on the low-elasticity underlayer is etched to obtain a shape of predetermined patterns of the electronic-part mounting pad and the wiring, respectively. In the present invention, it is preferable to design the rerouted wiring so that the resulting wiring becomes nonlinear.

After the electronic-part mounting pad and the rerouted wiring have been formed in the above method, it is preferable that a solder resist layer is formed from a resist material having a low modulus of elasticity like the low-elasticity underlayer to cover the electronic-part mounting pad and the rerouted wiring.

The wiring substrate of the present invention can be manufactured in the series of production steps described above. However, the manufacturing method of the present invention can employ a method generally used in the manufacture of the wiring substrate, and this can be optionally modified or improved within the scope of the present invention.

In the method of manufacturing the wiring substrate of the present invention, it is preferable that a high-elasticity underlayer made of a material having a higher modulus of elasticity than that of the base material of the wiring substrate is formed on the base material, and thereafter an external-connection terminal is formed on this high-elasticity underlayer in a predetermined pattern. The high-elasticity underlayer may be formed on the whole surface area of the base material or on a selected area of the surface of the base material, depending upon factors of desired stress relaxation levels, etc. Usually, the high-elasticity underlayer is formed to have a uniform film thickness. However, the film thickness of the high-elasticity underlayer may be varied depending on the portions of the high-elasticity underlayer.

As explained above, in the practice of the present invention, it is preferable that the low-elasticity underlayer is formed with a material having a Young's modulus of less than 1 GPa measured at a room temperature (20 to 30° C.) and a Young's modulus of 10 MPa or less measured at 150° C. Therefore, it is preferable that the wiring substrate of the present invention is manufactured according to the following process when the wiring substrate is a printed substrate like a built-up substrate.

(1) A low-elasticity underlayer is formed from a material having a Young's modulus of less than 1 GPa measured at a room temperature (20 to 30° C.) and having a Young's modulus of 10 MPa or less measured at 150° C. on the base material of the wiring substrate. On this base material, the external-connection terminal has already been formed, preferably through the high-elasticity underlayer. Preferably, the low-elasticity underlayer is formed so as not to cover the external-connection terminal.

(2) A through-hole is formed at a predetermined site of the resulting low-elasticity underlayer, that is, at a site where a connection via-hole is to be formed, according to a method described in detail below. Upon formation of this through-hole, a fine hole is formed that extends from the upper surface of the low-elasticity underlayer to the lower surface of the low-elasticity underlayer. On the bottom surface of the fine hole, a conductor formed on the base material or inside the base material is exposed.

(3) After forming the through-hole, a connection via-hole is formed by filling a conductive metal into this through-hole. At the same time as this process, or at a different time, the electronic-part mounting pad and the rerouted wiring are formed. This process can be carried out preferably based on a plating process and a subsequent etching process. It is possible to carry out both processes according to conventional methods. For example, in the plating process, copper, gold and other excellent conductive plating materials can be used. The plating method may be either an electroless plating method or an electrolytic plating method. It is possible to select an optimum plating thickness depending upon a kind of wiring element.

The above method of forming the through-hole will be explained in further detail. Usually, the through-hole is formed over the whole thickness direction of the low-elasticity underlayer. The end of the through-hole is closed with a conductor (a wiring pattern) on the base material. Therefore, the through-hole can take a structure that the conductor is exposed to the bottom surface of the through-hole. When the conductor is formed inside the base material, the through-hole may end at this conductor provided inside the base material. While it is possible to change the diameter of the through-hole over a wide range according to various factors, usually the through-hole has a diameter of about 0.05 to 0.5 mm.

The through-hole can be advantageously formed according to a drilling using a $CO_2$ laser, an excimer laser, or the like, or a plasma etching, while portions other than the through-hole are masked with a metal masking layer, for example.

When the wiring substrate of the present invention is made from a rigid substrate like a hard resin plate, a metal plate or a ceramic plate that does not have wiring, it is preferable to manufacture the wiring substrate according to the following process.

(1) A high-elasticity underlayer made of a material having a higher modulus of elasticity than that of a base material of the wiring substrate is formed, a low-elasticity underlayer made of a material having a lower modulus of elasticity than that of the base material is formed on the high-elasticity underlayer in a region smaller than the region of the same, and then a conductive metal layer is formed in substantially the same region as that of the high-elasticity underlayer. The high-elasticity underlayer and the low-elasticity underlayer can be formed in the manners as described above, respectively. Further, the conductive metal layer can also be formed according to adhesion of a conductive metal foil and others or formation of a conductive metal film, as described above.

(2) The conductive metal layer formed in the above process is selectively removed to thereby form the electronic-part mounting pad, the rerouted wiring, and the external-connection terminal in predetermined patterns respectively. The selective removal of the conductive layer can be carried out in accordance with the conventional methods as explained above. Preferably, the selective removal of the conductive layer can be carried out by etching.

It is also possible to advantageously manufacture the wiring substrate of the present invention according to the following process.

(1) A low-elasticity underlayer made of a material having a lower modulus of elasticity than that of a base material of the wiring substrate is formed, a high-elasticity underlayer made of a material having a higher modulus of elasticity than that of the base material is formed on the low-elasticity underlayer in a region smaller than the region of the same, and then a conductive metal layer is formed in substantially the same region as that of the low-elasticity underlayer. The high-elasticity underlayer and the low-elasticity underlayer can be formed in the manners described above, respectively. Further, the conductive metal layer can also be formed according to adhesion of a conductive metal foil or formation of a conductive metal film, as described above.

(2) The conductive metal layer formed in the above process is selectively removed to thereby form the electronic-part mounting pad, the rerouted wiring, and the external-connection terminal in predetermined patterns respectively. The selective removal of the conductive layer can be carried out in accordance with the conventional methods as explained above. Preferably, the selective removal of the conductive layer can be carried out by etching.

Further, in the practice of the above manufacturing methods, the thickness of the high-elasticity underlayer and the thickness of the low-elasticity underlayer may be area-wise varied depending upon the desired stress relaxation levels or the like, as explained above. Accordingly, it becomes possible to optimize the stress relaxation.

The two above-described manufacturing methods are different in that the occupied regions of the underlayers are differentiated at the time of forming the high-elasticity underlayer and the low-elasticity underlayer on the base material. However, both methods can achieve sufficient stress relaxation. Therefore, it is possible to realize unique effects of the present invention, such as, for example, improvement in the connection reliability, simplification of the packaging work, and utilization of conventional techniques of manufacturing printed boards or conventional built-up techniques.

The present invention also provides a semiconductor device in addition to the above-described wiring substrate. The semiconductor device of the present invention comprises a wiring substrate equipped with a rerouted wiring having one end connected to an electronic-part mounting pad for electrically connecting an electronic part and another end connected to an external-connection terminal, in combination with an electronic part that is electrically connected and mounted on the electronic-part mounting pad of the wiring substrate. The wiring substrate is the wiring substrate of the present invention. In other words, in the semiconductor device of the present invention, a low-elasticity underlayer made of a material having a lower modulus of elasticity than that of a base material of the wiring substrate is disposed between the base material of the wiring substrate and each of the electronic-part mounting pad and the wiring.

The basic structure of the semiconductor device is not particularly limited to the above. It is also possible to have a structure similar to that of a known semiconductor device. Further, as an extended scope of the present invention, it is also possible to include other similar electronic parts.

Further, it is possible to manufacture the semiconductor device of the present invention according to a method generally used for the manufacture of a semiconductor device. However, it is preferable that the wiring substrate is manufactured according to the methods of the present invention which have been already explained.

Further, in the semiconductor device of the present invention, the electronic parts mounted on the base material are not particularly limited. The semiconductor devices may be any parts generally used in the manufacture of a semiconductor device. Suitable electronic parts are not restricted, and include, for example, semiconductor chips like an LSI chip and a VLSI chip. These semiconductor chips have various sizes depending on kinds of chips. Generally, these semiconductor chips include a wide range of thickness from a small thickness of about 40 to 50 $\mu$m to a large thickness of about 500 $\mu$m.

Further, in the semiconductor device of the present invention, at least one, or usually two or more semiconductor chips may be mounted on each base material, according to need, and the mounted base materials are electrically connected to each other in a laminated state, thereby to manufacture a composite semiconductor device. A various types of composite semiconductor devices are included. Usually, it is preferable that devices of the same size are laminated in the thickness direction, and these devices are electrically connected to each other. This composite semiconductor device is particularly useful for the production of a memory module or the like.

The semiconductor device provided by the present invention can be advantageously used for a portable telephone, a personal computer and, particularly, a portable personal computer, and other portable electric and electronic devices.

EXAMPLES

Examples of the present invention will be explained below with reference to the attached drawings. It should be understood that the shown examples are representative examples, and they can be variously modified and improved within the scope of the present invention.

Figure 2:
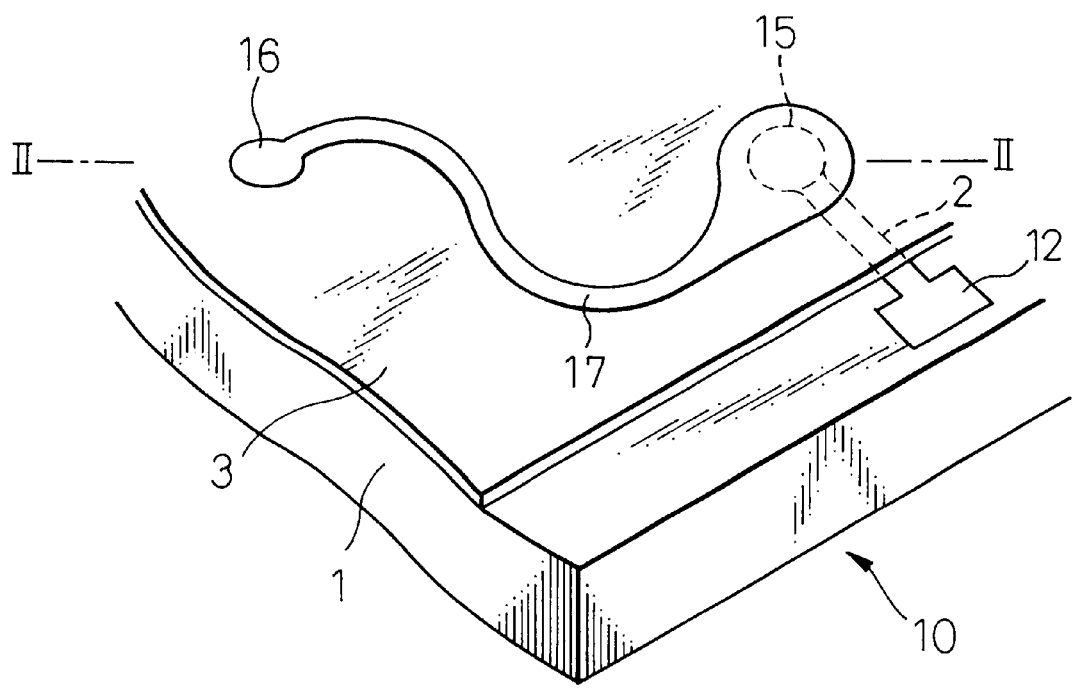
FIG. 2 is a perspective view showing a wiring pattern on the surface of a wiring substrate according to one preferred embodiment of the present invention.

FIG. 2 is a perspective view of a wiring pattern on the surface of a wiring substrate according to one preferred embodiment of the present invention. As shown in the drawing, a wiring substrate 10 has a rerouted wiring 17 on its upper surface. The rerouted wiring 17 has one end terminated at an electronic-part mounting pad 16 and the other end terminated at an external-connection terminal 12. The rerouted wiring 17, the pad 16, and the external-connection terminal 12 each is a product of etching of a copper foil after the copper foil has been adhered to the base material.

Figure 3:
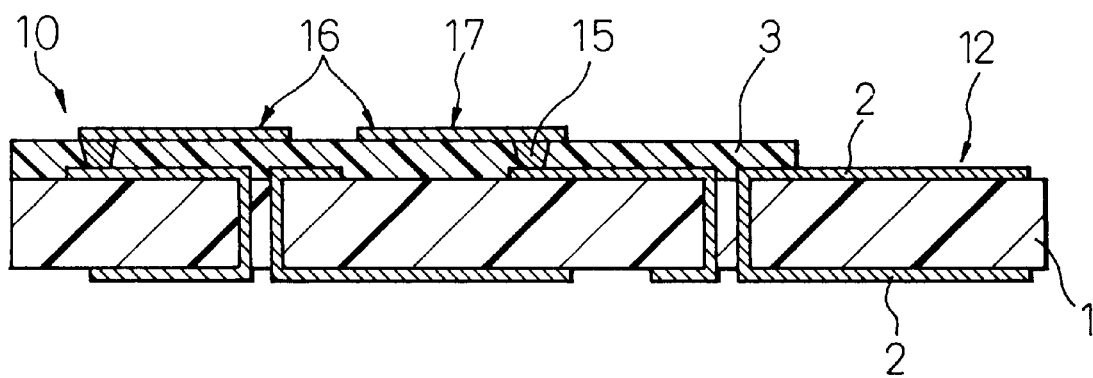
FIG. 3 is a cross-sectional view taken along a line II—II of the wiring substrate shown in FIG. 2.

The structure of the wiring substrate shown in FIG. 2 will be easily understood from FIG. 3 that is a cross-sectional view of the wiring substrate taken along a line II—II of FIG. 2. The wiring substrate 10 is manufactured using a rigid copper-plated laminate plate. Conductors 2 are formed on both surfaces of an insulating plastic base material 1 upon selective etching of copper foils on both surfaces. The conductors 2 on both surfaces of the base material 1 are electrically connected to each other by copper-plated through-holes, as illustrated. On one surface of the base material 1, the external-connection terminal 12 is formed from a part of the conductor 2, and other portions are covered with a low-elasticity underlayer 3 in a predetermined film thickness. The low-elasticity underlayer 3 consists of a thermosetting epoxy resin containing a rubber component (a rubber-like material). Connection via-holes 15 are formed at predetermined sites of the low-elasticity underlayer 3 for having an electric connection with the conductor 2 formed beneath the low-elasticity underlayer 3. Each connection via-hole 15 is formed by copper plating on the through-hole. On the surface of the low-elasticity underlayer 3, the electronic-part mounting pad 16 and the rerouted wiring 17 are formed in the pattern, as shown in FIG. 2, according to etching of the copper foil. As one characteristic of the present invention, the rerouted wiring 17 is formed in a curved shape to make the wiring substrate 10 movable. Further, in order to increase the stress relaxation effect of the present invention, the base material 1 itself beneath the external-connection terminal 12 can act as a high-elasticity underlayer.

The wiring substrate shown in FIG. 3 can be advantageously formed in the steps as shown in sequence in FIGS. 4A to 4D.

Figure 4A:
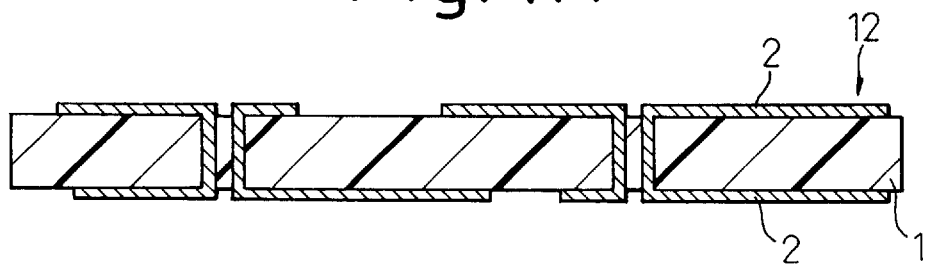
FIGS. 4A to 4D are cross-sectional views showing, in sequence, a method of manufacturing the wiring substrate shown in FIG. 3.

First, as shown in FIG. 4A, the conductors 2 are formed on both surfaces of the insulating plastic base material 1. At the same time the external-connection terminal 12 is formed on one surface (the upper surface in this figure). For this process, the glass epoxy base material 1 having a thickness of 1.0 mm and having the copper foil (Cu) 2 of a film thickness of 18 $\mu$m on both surfaces thereof is provided. Thereafter, through-holes are formed by drilling at predetermined sites (two sites in this figure) of the base material 1.

After forming the through-holes, copper is plated on the through-holes in order to provide an electric connection between the copper foils 2 (that become the conductors later) on both surfaces of the base material 1. In this instance, after electroless-copper-plating, an electrolytic plating is carried out using the copper foils 2 as electrodes. The copper plating has a film thickness of about 15 $\mu$m.

After the copper plating of the through-holes has been completed, unnecessary portions of the copper foils 2 are removed by dissolving these portions in order to form the conductors (the wiring patterns) 2 and the external-connection terminal 12. Although not shown, this process can be carried out by first coating an etching resist corresponding to a desired wiring pattern onto the copper foil 2, and curing this etching resist. Then, the unnecessary portions of the copper foil 2 not covered with the resist film are removed by dissolving these portions with a suitable etchant (a solution of ferric chloride in this instance). The used resist film is then dissolved and removed with a suitable solution.

Figure 4B:
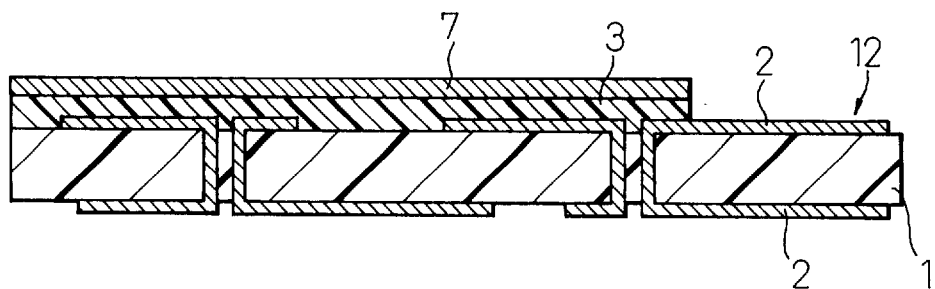

Next, as shown in FIG. 4B, the low-elasticity underlayer 3 is selectively formed in a predetermined film thickness on the surface of the base material 1 in such a manner that the external-connection terminal 12 is not covered. In this instance, a copper foil 7 having a film thickness of 18 $\mu$m is disposed on a thermosetting epoxy resin sheet having a rubber elasticity (with a film thickness of 50 $\mu$m), and then heated at 180° C. for thirty minutes under pressure (3 MPa) to thereby laminate the copper foil onto the epoxy resin sheet.

Figure 4C:
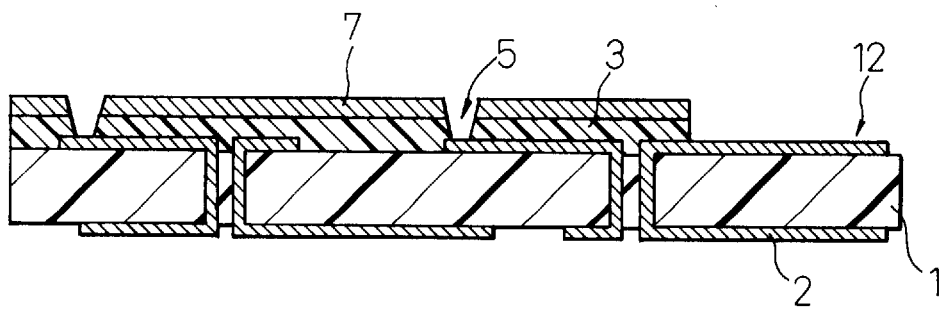

Next, as shown in FIG. 4C, a predetermined portion of the copper foil 7 is etched to remove this portion. Next, using this copper foil 7 as a mask, a through-hole 5 is formed at a predetermined position of the low-elasticity underlayer 3 in order to have an electric conduction with the conductor 2 that is formed beneath this low-elasticity underlayer 3. The through-hole 5 has a diameter of 100 $\mu$m, and is formed upon $CO_2$ laser drilling.

Figure 4D:
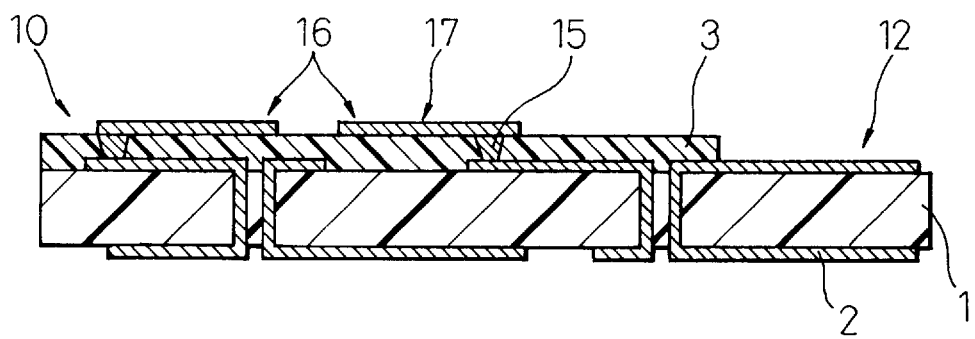

Last, as shown in FIG. 4D, the through-hole 5 of the low-elasticity underlayer 3 is copper plated to thereby form a connection via-hole 15. Further, a selective etching of the copper foil 7 is carried out on the surface of the low-elasticity underlayer 3 to thereby form the electronic-part mounting pad 16 and the rerouted wiring 17. After the above-described series of processes, it is possible to manufacture the wiring substrate 10 as shown in FIG. 3. It should be particularly noted that the manufacturing method of the present invention can be achieved according to the conventional manufacturing process by utilizing the conventional printed wiring technique (the formation of the conductors based on the copper foil patterning) and the built-up technique (for example, the formation of the connection via-holes based on the laser processing and the electroless plating). Further, the manufacturing is simple, and it is possible to reduce the manufacturing cost.

Figure 5:
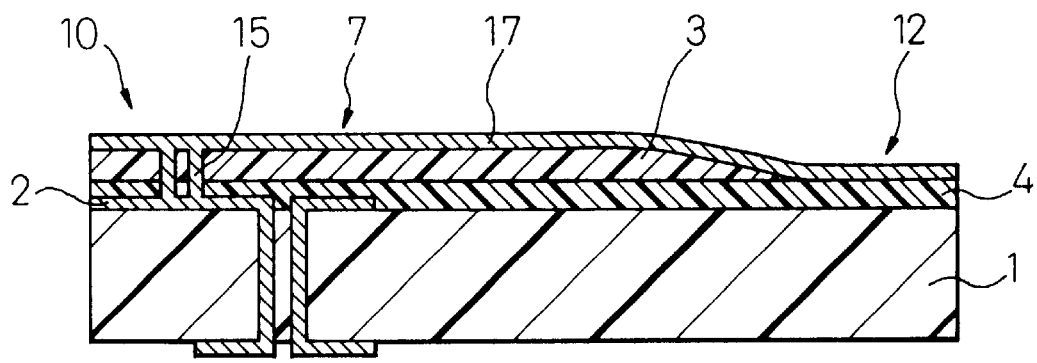
FIG. 5 is a cross-sectional view showing another preferred embodiment of the wiring substrate according to the present invention.
Figure 6:
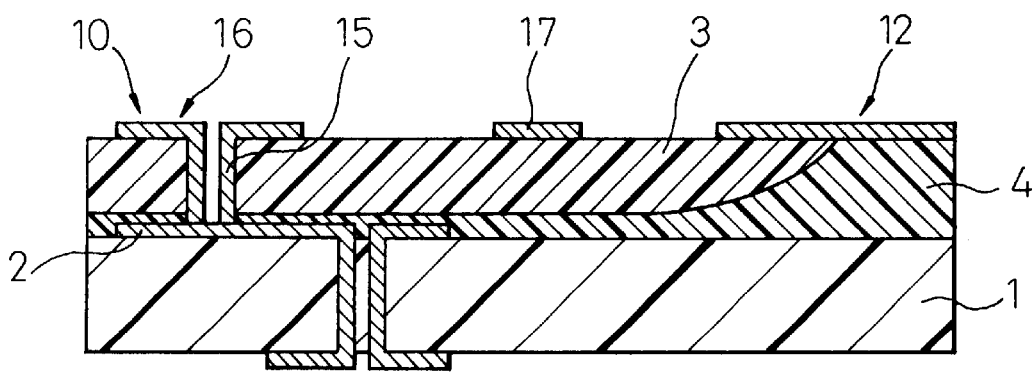
FIG. 6 is a cross-sectional view showing still another preferred embodiment of the wiring substrate according to the present invention.
Figure 7:
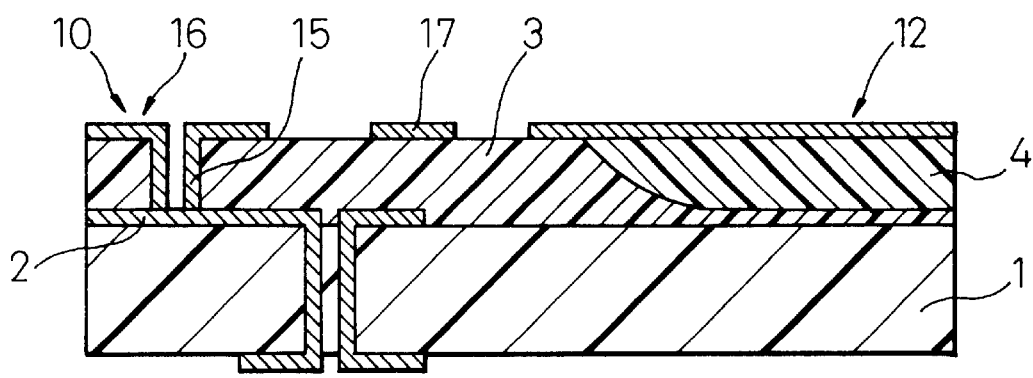
FIG. 7 is a cross-sectional view showing still another preferred embodiment of the wiring substrate according to the present invention.

FIGS. 5, 6 and 7 each is a cross-sectional view showing one preferred embodiment of a built-up wiring substrate according to the present invention. Each wiring substrate has a combination of a high-elasticity underlayer and a low-elasticity underlayer disposed according to the present invention under the wiring pattern, and thus the rerouted wiring is movable. Accordingly, each wiring substrate can achieve a remarkable stress relaxation and improvement in the connection reliability. Further, since an external-connection terminal is formed on the material having a high modulus of elasticity, it facilitates the work of inserting a memory into the slot and inserting a card, without involving trouble. Note that since the constituent elements of the wiring substrate shown in these figures are basically the same as those of the wiring substrate 10 explained above with reference to FIG. 3 and FIGS. 4A to 4D, their detailed explanation will be omitted here.

In a wiring substrate 10 shown in FIG. 5, a high-elasticity underlayer 4 is formed in a predetermined film thickness on one surface of a plastic base material 1 that has a conductor 2 provided in a predetermined pattern. A low-elasticity underlayer 3 is formed on the high-elasticity underlayer 4 escaping from the region of an external-connection terminal 12. A rerouted wiring 17 and the external-connection terminal 12 are formed to cover the high-elasticity underlayer 4 and the low-elasticity underlayer 3. The rerouted wiring 17 and the conductor 2 are electrically connected with each other via a connection via-hole 15. Preferably, this integrated structure of lamination can be advantageously formed by laminating a copper foil 7 for forming the high-elasticity underlayer 4, the low-elasticity underlayer 3, the rerouted wiring 17, and the conductor 2 respectively, then heating these parts under pressure, and finally curing these parts.

In a wiring substrate 10 shown in FIG. 6, a high-elasticity underlayer 4 is formed in different film thicknesses on one surface of a plastic base material 1 that has a conductor 2 provided in a predetermined pattern. That is, the high-elasticity underlayer 4 is formed in a predetermined pattern so that its region corresponding to an external-connection terminal 12 has a large thickness and other regions have a small thickness. On the high-elasticity underlayer 4, a low-elasticity underlayer 3 is formed so that the total thickness of the high-elasticity underlayer 4 and the low-elasticity underlayer 3 becomes constant to match the largest thickness of the high-elasticity underlayer 4. The external-connection terminal 12 is formed on the high-elasticity underlayer 4. An electronic-part mounting pad 16 and a rerouted wiring 17 are formed on the low-elasticity underlayer 3. The electronic-part mounting pad 16 and the conductor 2 are electrically connected to each other via a connection via-hole 15. In the wiring substrate shown in FIG. 6 contrary to that shown in FIG. 5 the surface of the wiring pattern has a flat surface due to application of the special manufacturing process.

The built-up wiring substrate 10 shown in FIG. 6 can be advantageously manufactured in the steps as shown in sequence in FIGS. 8A to 8D, for example.

Figure 8A:
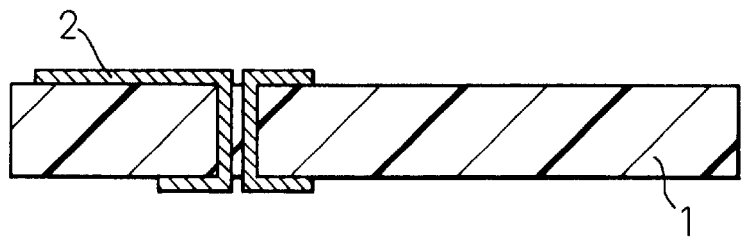
FIGS. 8A to 8D are cross-sectional views showing, in sequence, a method of manufacturing the wiring substrate shown in FIG. 6.

First, as shown in FIG. 8A, the conductors 2 are formed on both surfaces of the base material 1 of the built-up wiring substrate (a wiring layer and others are not shown to simplify the explanation). Further, a through-hole is formed as shown, and the through-hole is copper-plated to make an electric connection between both conductors 2 on both surfaces of the base material 1.

Figure 8B:
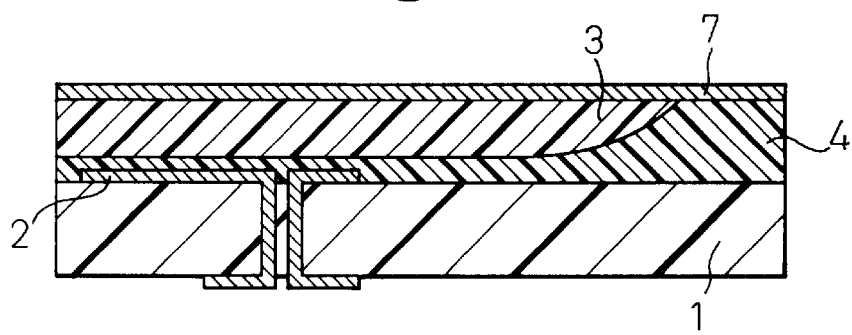

Next, as shown in FIG. 8B, the high-elasticity underlayer 4 is formed on the surface of the base material 1 to have different thicknesses. The low-elasticity underlayer 3 is formed on this high-elasticity underlayer 4 to have a predetermined film thickness. Further, the copper foil 7 is formed on the low-elasticity underlayer 3 and the high-elasticity underlayer 4. In this instance, the total thickness of the high-elasticity underlayer 4 and the low-elasticity underlayer 3 is made uniform, with a flat surface of the combined underlayer. For this purpose, it is possible to advantageously use a method of laminating a material for use in the formation of the low-elasticity underlayer 3 having a larger thickness than that shown in the drawing on the high-elasticity underlayer 4, and then strongly pressing these underlayers with a suitable tool under heating.

Figure 8C:
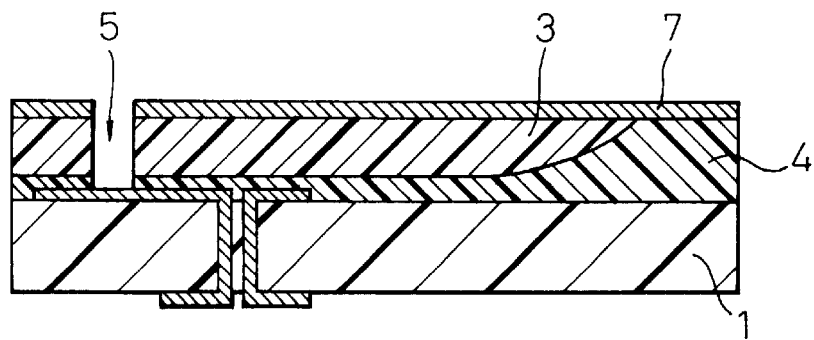

After completing the formation of the combined underlayer, as shown in FIG. 8C, the through-hole 5 is formed at a predetermined position of the low-elasticity underlayer 3 in order to electrically connect between the electronic-part mounting pad to be formed at the subsequent step and the conductor 2 formed beneath the low-elasticity underlayer 3. The through-hole 5 can be formed advantageously with laser drilling.

Figure 8D:
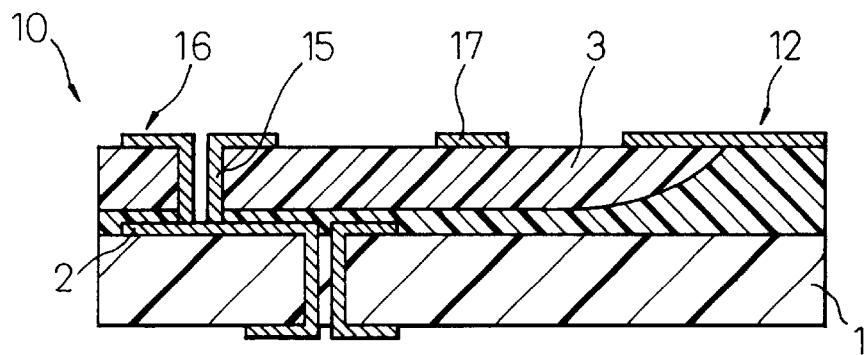

Last, as shown in FIG. 8D, the through-hole 5 of the low-elasticity underlayer 3 is copper-plated to thereby form the connection via-hole 15. On the surface of the low-elasticity underlayer 3 and on the surface of the high-elasticity underlayer 4, the copper foil 7 is selectively etched to form the electronic-part mounting pad 16 and the rerouted wiring 17 on the low-elasticity underlayer 3, according to the process similar to that used in the formation of the conductor 2. At the same time, the external-connection terminal 12 is formed on the high-elasticity underlayer 4. Using the above-described series of process, it is possible to manufacture the wiring substrate 10 shown in FIG. 6.

In a wiring substrate 10 shown in FIG. 7, a high-elasticity underlayer 4 is formed on one surface of a plastic base material 1 that has a conductor 2 provided in a predetermined pattern, with the high-elasticity underlayer 4 positioned only in the region beneath an external-connection terminal 12. The high-elasticity underlayer 4 is formed to have a small thickness toward one end as shown in the drawing. Adjacent to the high-elasticity underlayer 4, a low-elasticity underlayer 3 is formed in a film-thickness distribution as shown in the drawing. In this illustrated instance, the low-elasticity underlayer 3 has a thickness of 50 $\mu$m or more, and at the same time, has a very small thickness of 10 $\mu$m or less at the portion beneath the high-elasticity underlayer 4. The total thickness of the composite underlayer of the high-elasticity underlayer 4 and the low-elasticity underlayer 3 is constant. An external-connection terminal 12 is formed on the high-elasticity underlayer 4, and an electronic-part mounting pad 16 and a rerouted wiring 17 are formed on the low-elasticity underlayer 3. The electronic-part mounting pad 16 and the conductor 2 are electrically connected to each other via a connection via-hole 15.

The wiring substrate 10 shown in FIG. 7 has a structure similar to that of the wiring substrate 10 shown in FIG. 6. Therefore, it is possible to advantageously manufacture this wiring substrate by utilizing the method described with reference to FIGS. 8A to 8D.

Figure 9:
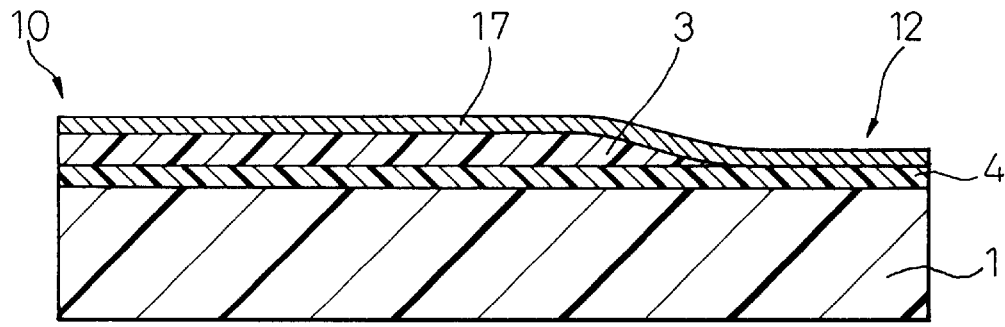
FIG. 9 is a cross-sectional view showing still another preferred embodiment of the wiring substrate according to the present invention.
Figure 10:
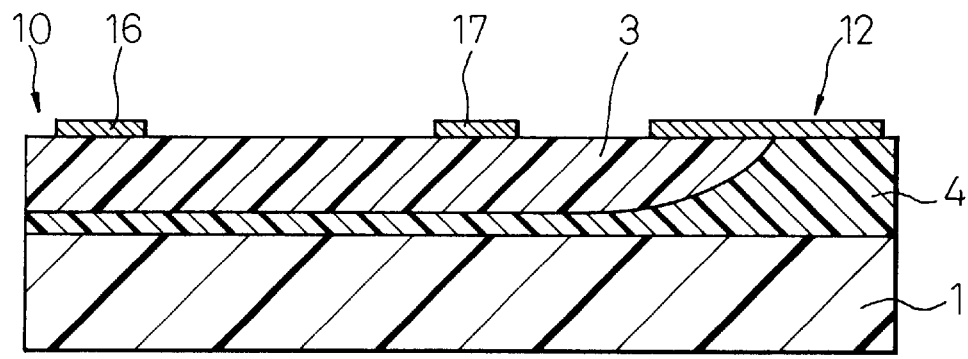
FIG. 10 is a cross-sectional view showing still another preferred embodiment of the wiring substrate according to the present invention.
Figure 11:
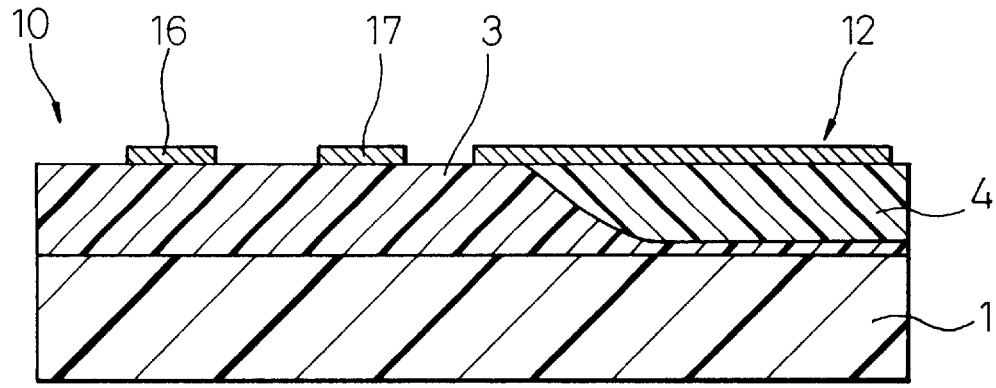
FIG. 11 is a cross-sectional view showing still another preferred embodiment of the wiring substrate according to the present invention.

Each of FIGS. 9, 10 and 11 is a cross-sectional view showing preferred embodiments of a wiring substrate of the present invention. The illustrated wiring substrates 10 have structures similar to those of the wiring substrates 10 shown in FIGS. 5 to 7, except that rigid substrates are used in place of the built-up wiring substrates in FIGS. 5 to 7, and that a wiring pattern is formed on only one surface of the base material. In view of the above differences, detailed explanation of the respective constituent elements of the wiring substrates of FIGS. 9 to 11 will be omitted here.

In the wiring substrate 10 shown in FIG. 9, a high-elasticity underlayer 4 is formed in a predetermined film thickness on one surface of a rigid plastic base material 1. A low-elasticity underlayer 3 is formed on this high-elasticity underlayer 4 escaping from the region of an external-connection terminal 12. A rerouted wiring 17 and the external-connection terminal 12 are formed to cover the high-elasticity underlayer 4 and the low-elasticity underlayer 3.

In the wiring substrate 10 shown in FIG. 10, a high elasticity underlayer 4 is formed in different film thicknesses on one surface of a rigid plastic base material 1. That is, the high-elasticity underlayer 4 is formed in a predetermined pattern so that the region corresponding to an external-connection terminal 12 has a large thickness and other regions have a small thickness. On the high-elasticity underlayer 4, a low-elasticity underlayer 3 is formed so that the total thickness of the high-elasticity underlayer 4 and the low-elasticity underlayer 3 becomes constant to match the largest thickness of the high-elasticity underlayer 4. The external-connection terminal 12 is formed on the high-elasticity underlayer 4. An electronic-part mounting pad 16 and a rerouted wiring 17 are formed on the low-elasticity underlayer 3.

In the wiring substrate 10 shown in FIG. 11, a high-elasticity underlayer 4 is formed on one surface of a rigid plastic base material 1 in such a manner that the high-elasticity underlayer 4 is positioned only in the region beneath an external-connection terminal 12. Adjacent to the high-elasticity underlayer 4, a low-elasticity underlayer 3 is formed in a film-thickness distribution as shown in the drawing. That is, the low plasticity underlayer 3 has a large film thickness in the region beneath a electronic-part mounting pad 16 and a rerouted wiring 17, and at the same time, has a very small film thickness at the other portion beneath the high-elasticity underlayer 4. The total thickness of the composite underlayer of the high-elasticity underlayer 4 and the low-elasticity underlayer 3 is constant. The external-connection terminal 12 is formed on the high-elasticity underlayer 4. The electronic-part mounting pad 16 and the rerouted wiring 17 are formed on the low-elasticity underlayer 3.

The wiring substrate 10 shown in FIG. 11 can be manufactured by utilizing the method explained above with reference to FIGS. 8A to 8D. The method of manufacturing this wiring substrate will be explained below, in sequence, with reference to FIGS. 12A and 12B.

Figure 12A:
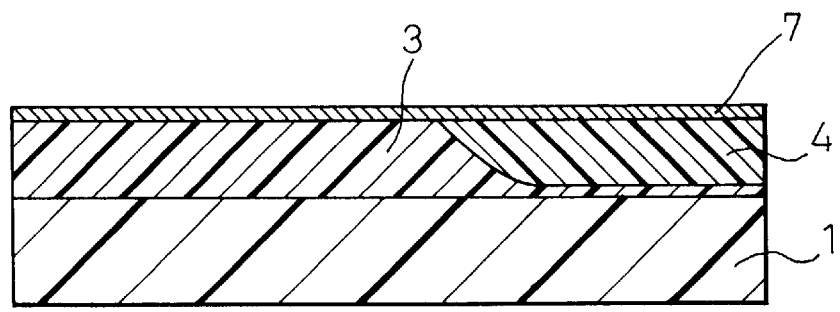
FIGS. 12A and 12B are cross-sectional views showing, in sequence, a method of manufacturing the wiring substrate shown in FIG. 11.

First, as shown in FIG. 12A, the high-elasticity underlayer 4, the low-elasticity underlayer 3, and the copper foil 7 are formed in predetermined film thicknesses respectively on one surface of the rigid plastic base material 1. In this instance, the total thickness of the high-elasticity underlayer 4 and the low-elasticity underlayer 3 is made uniform over the whole surface of the base material 1, with a flat surface of the composite underlayer. For this purpose, it is possible to advantageously use a method of laminating a material for use in the formation of the low-elasticity underlayer 3 having a larger thickness than that shown in the drawing on the high-elasticity underlayer 4, and then strongly pressing these layers with a suitable tool.

Figure 12B:
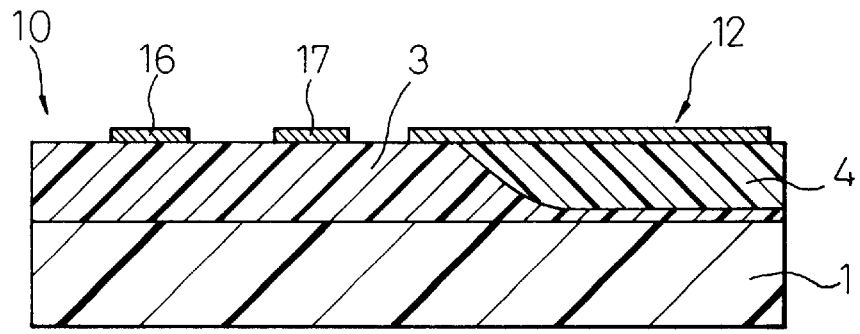

After adhering of the copper plate, as shown in FIG. 12B, the copper foil 7 is etched according to a desired wiring pattern to thereby remove unnecessary portions through dissolution. The electronic-part mounting pad 16 and the rerouted wiring 17 are formed on the surface of the low-elasticity underlayer 3. At the same time, the external-connection terminal 12 is formed on the high-elasticity underlayer 4. After completion of the above-described process, the wiring substrate 10 shown in FIG. 11 is obtained.

Figure 13:
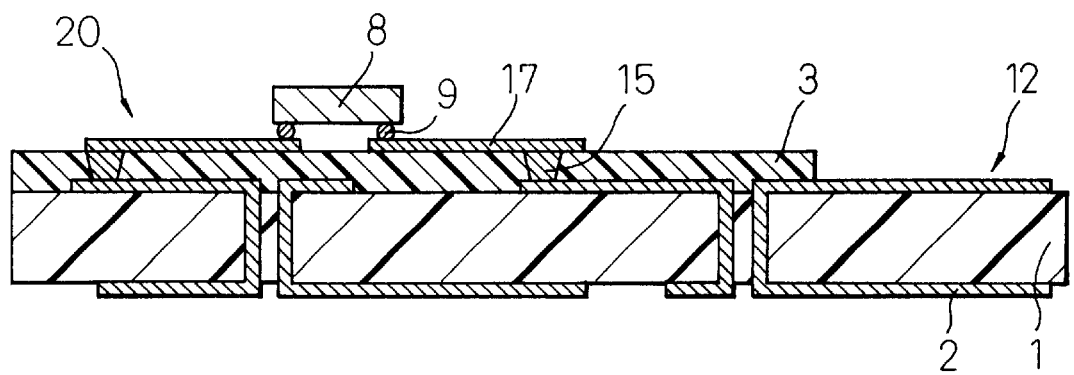
FIG. 13 is a cross-sectional view one preferred embodiment of the semiconductor device according to the present invention.

FIG. 13 is a cross-sectional view showing a preferred embodiment of a semiconductor device of the present invention. As can be understood from the drawing, a wiring substrate 10 used in this semiconductor device 20 is similar to the wiring substrate 10 explained above with reference to FIG. 3. A semiconductor chip (an LSI chip, in this instance) 8 is mounted on an electronic-part mounting pad 16 of the wiring substrate 10 via metal bumps 9 consisting of gold (Au). These metal bumps 9 are fitted to the lower surface of the semiconductor chip 8. The semiconductor chip 8 attached with these bumps 9 is commercial available.

As can been understood from the above, according to the present invention, it is possible to increase the reliability of a connection between the pad of the wiring substrate and the electronic part like a semiconductor chip, without a complex structure or a complex manufacturing process.

Further, according to the present invention, since a material layer of a low modulus of elasticity is disposed between the electronic-part mounting pad and the rerouted wiring, and a line between the fixed points (the line of the rerouted wiring) is connected nonlinearly at the time of packaging, it is possible to relax the stress attributable to a difference between the coefficient of thermal expansion of the packaging substrate and the coefficient of thermal expansion of the electronic part. As a result, it is possible to increase the connection reliability. Further, as it is possible to freely move the lead at the time of packaging, it is possible to increase the degree of freedom of the packaging.

Furthermore, since a material layer of a high modulus of elasticity is disposed beneath the external-connection terminal of the wiring substrate, it is possible to easily insert the semiconductor device such as a memory card or the like, into a slot, according to the conventional manner. There is also high reliability in this insertion work.

Moreover, since the wiring substrate of the present invention has a simple structure, and has no large difference from the structure of the conventional wiring substrate, it is possible to manufacture the wiring substrate according to the conventional technique of manufacturing a printed circuit board and the conventional built-up wiring technique.

In addition, according to the present invention, since it is not necessary to previously package the electronic part like a semiconductor element, prior to mounting the package onto the wiring substrate, it is possible to realize a reduction in the cost of a module substrate and others, and a reduction in the delivery time.

What is claimed is:

1. A wiring substrate equipped with a rerouted wiring having one end connected to an electronic-part mounting pod for electrically connecting an electronic part and another end connected to an external-connection terminal, in which said wiring substrate comprises a base body having selectively formed thereon a low-elasticity underlayer, made of a material having a lower modulus of elasticity than that of the base body, in a pattern that the external-connection terminal is exposed in a surface of the base body, said underlayer being positioned between the base body of the wiring substrate and each of the electronic-part mounting pad and the rerouted wiring.

2. A wiring substrate according to claim 1, in which a high-elasticity underlayer, made of a material having a higher modulus of elasticity than that of the base material of the wiring substrate is disposed between the base material of the wiring substrate and the external-connection terminal.

3. A wiring substrate according to claim 2, in which the low-elasticity underlayer is made of a material having a Young's modulus of less than 1 GPa measured at a room temperature (20 to 30° C.) and a Young's modulus of 10 MPa or less measured at 150° C.

4. A wiring substrate according to claim 3, in which the rerouted wiring is covered with a solder resist layer, and the solder resist layer is made of a resist material having a Young's modulus of less than 1 GPa measured at a room temperature (20 to 30° C.) and a Young's modulus of 10 MPa or less measured at 150° C.

5. A wiring substrate according to claim 4, in which the low-elasticity underlayer extends between the base material of the wiring substrate and the external-connection terminal, the low-elasticity underlayer in the region of the electronic-part mounting pad and the rerouted wiring has a thickness of 50 $\mu$m or more, and the low-elasticity underlayer in the region of the external-connection terminal has a thickness of 10 $\mu$m or less.

6. A wiring substrate according to claim 5, in which the rerouted wiring is formed in a nonlinear pattern, at least, between the electronic-part mounting pad and the external-connection terminal.

7. A semiconductor device comprising a wiring substrate equipped with a rerouted wiring having one end connecting an electronic-part mounting pad for electrically connected an electronic part and another end connected to an external-connection terminal, and an electronic part electrically connected and mounted on the pad of the wiring substrate, in which said wiring substrate comprises a base body having selectively formed thereon a low-elasticity underlayer, made of a material having a lower modulus of elasticity than that of the base body, in a pattern that the external-connection terminal is exposed in a surface of the base body, said underlayer being positioned between the base body of the wiring substrate and each of the electronic-part mounting pad and the rerouted wiring.

8. A wiring substrate according to claim 1 in which the low-elasticity underlayer is made of a material having a Young's modulus of less than 1 GPa measured at a room temperature (20 to 30° C.) and a Young's modulus of 10 MPa or less measured at 150° C.

9. A wiring substrate according to claim 1, in which the rerouted wiring is covered with a solder resist layer, and the solder resist layer is made of a resist material having a Young's modulus of less than 1 GPa measured at a room temperature (20 to 30° C.) and a Young's modulus of 10 MPa or less measured at 150° C.

10. A wiring substrate according to claim 2, in which the rerouted wiring is covered with a solder resist layer, and the solder resist layer is made of a resist material having a Young's modulus of less than 1 GPa measured at a room temperature (20 to 30° C.) and a Young's modulus of 10 MPa or less measured at 150° C.

11. A wiring substrate according to claim 1 in which the low-elasticity underlayer extends between the base material of the wiring substrate and the external-connection terminal, the low-elasticity underlayer in the region of the electronic-part mounting pad and the rerouted wiring has a thickness of 50 μm or more, and the low-elasticity underlayer in the region of the external-connection terminal has a thickness of 10 μm or less.

12. A wiring substrate according to claim 2 in which the low-elasticity underlayer extends between the base material of the wiring substrate and the external-connection terminal, the low-elasticity underlayer in the region of the electronic-part mounting pad and the rerouted wiring has a thickness of 50 μm or more, and the low-elasticity underlayer in the region of the external-connection terminal has a thickness of 10 μm or less.

13. A wiring substrate according to claim 3 in which the sow-elasticity underlayer extends between the base material of the wiring substrate and the external-connection terminal, the low-elasticity underlayer in the region of the electronic-part mounting pad and the rerouted wiring has a thickness of 50 μm or more, and the low-elasticity underlayer in the region of the external-connection terminal has a thickness of 10 μm or less.

14. A wiring substrate according to claim 1 in which the rerouted wiring is formed in a nonlinear pattern, at least, between the electronic-part mounting pad and the external-connection terminal.

15. A wiring substrate according to claim 2 in which the rerouted wiring is formed in a nonlinear pattern, at least, between the electronic-part mounting pad and the external-connection terminal.

16. A wiring substrate according to claim 3 in which the rerouted wiring is formed in a nonlinear pattern, at least, between the electronic-part mounting pad and the external-connection terminal.

17. A wiring substrate according to claim 4 in which the rerouted wiring is formed in a nonlinear pattern, at least, between the electronic-part mounting pad and the external-connection terminal.

18. A method of manufacturing a wiring substrate according to which comprises the steps of:

forming a low-elasticity underlayer from a material having a Young's modulus of less than 1 GPa measured at a room temperature (20 to 30° C.) and a Young's modulus of 10 MPa or less measured at 150° C., on the base material of the wiring substrate;

forming a through-hole that extends from the upper surface of the low-elasticity underlayer to the rerouted wiring on the base material located at the lower surface of the low-elasticity underlayer, at a predetermined position of the low-elasticity underlayer; and forming, by plating, a connection via-hole in the through-hole, the electronic-part mounting pad, and the rerouted wiring.

* * * * *